United States Patent
Tsutsumi et al.

(10) Patent No.: US 6,656,996 B2
(45) Date of Patent: Dec. 2, 2003

(54) SEMICONDUCTOR-SEALING RESIN COMPOSITION AND SEMICONDUCTOR DEVICE USING IT

(75) Inventors: Yasuaki Tsutsumi, Otsu (JP); Tetsuya Mieda, Nagoya (JP); Masayuki Tanaka, Nagoya (JP); Toshimi Kawahara, Kawasaki (JP); Yukio Takigawa, Kawasaki (JP)

(73) Assignees: Sumitomo Bakelite Co. Ltd., Tokyo (JP); Fujitsu Limited, Kanagawa (JP)

( * ) Notice: Subject to any disclaimer, the term of this patent is extended or adjusted under 35 U.S.C. 154(b) by 0 days.

(21) Appl. No.: 09/572,007

(22) Filed: May 16, 2000

(65) Prior Publication Data

US 2003/0027918 A1 Feb. 6, 2003

(30) Foreign Application Priority Data

May 17, 1999 (JP) ............................................ 11-135800

(51) Int. Cl.$^7$ .............................. C08K 3/36; C08L 63/00
(52) U.S. Cl. .................... 524/492; 523/443; 523/466
(58) Field of Search .................... 524/492; 523/443, 523/466

(56) References Cited

U.S. PATENT DOCUMENTS

| | | | | | |
|---|---|---|---|---|---|
| 5,254,605 | A | * | 10/1993 | Kim et al. ................... | 523/428 |
| 5,798,400 | A | * | 8/1998 | Tokunaga et al. ............ | 523/443 |
| 5,976,916 | A | * | 11/1999 | Kuwamura et al. .......... | 438/126 |
| 5,998,509 | A | * | 12/1999 | Hayase et al. ............... | 523/425 |
| 6,063,646 | A | * | 5/2000 | Okuno et al. ................ | 438/107 |
| 6,162,878 | A | * | 12/2000 | Osada et al. ................. | 525/481 |
| 6,172,143 | B1 | * | 1/2001 | Amano et al. ............... | 523/461 |
| 6,214,905 | B1 | * | 4/2001 | Garrett ........................ | 523/443 |
| 6,221,509 | B1 | * | 4/2001 | Hirano et al. ................ | 428/620 |
| 6,297,306 | B1 | * | 10/2001 | Osada et al. ................. | 524/406 |
| 6,358,629 | B1 | * | 3/2002 | Aga ............................. | 428/620 |

\* cited by examiner

*Primary Examiner*—Callie Shosho
(74) *Attorney, Agent, or Firm*—Piper Rudnick LLP

(57) ABSTRACT

Resin composition for sealing semiconductor devices, which contains a filler (A) of spherical fused silica having maximum particle size of not larger than 45 $\mu$m and may contain metal impurities having a particle size of not larger than 53 $\mu$m; and a semiconductor device sealed with the resin composition.

12 Claims, 2 Drawing Sheets

SEMICONDUCTOR-SEALING RESIN COMPOSITION AND SEMICONDUCTOR DEVICE USING IT

BACKGROUND OF THE INVENTION

Field of the Invention

The present invention relates to a resin composition to be used for protecting semiconductor chips, and to a semiconductor device. In particular, the invention relates to a protective film, an under filler, a liquid sealant, a semiconductor-sealing resin composition containing a sealant, and also to a semiconductor device so sealed.

With the recent tendency toward downsized portable appliances, parts of semiconductor devices for those appliances are being downsized and thinned, and their quality is being much improved.

A conventional, resin-sealed semiconductor device comprises semiconductor chips and an interposer (lead frame), in which the chips except outer electrodes (pins) that are necessary for mounting the chips on a printed circuit board are sealed with a resin on both surfaces. Therefore, developing and improving a method of mounting semiconductor chips on a lead frame has heretofore been essentially targeted for downsized semiconductor devices.

For example, quad flat packages (QFP) with outer electrodes aligned on all four sides of each package have been developed from small outline J-lead packages (SOJ) with outer electrodes aligned only on two sides of each package; and lead on chip packages (LOC), with chips on inner lead pins for increasing the chip occupation in one package, have been developed from others with chips mounted on the stage of lead frames.

With the recent tendency toward downsized multi-pinned semiconductor devices (packages), in addition, ball grid array packages (BGA), pin grid array packages (PGA), land grid array packages (LGA) and the like, where outer electrodes are two-dimensionally spread on the outer surface of each package have been developed. In these, the number of pins can be increased without the pin-to-pin distance being reduced. However, even in BGA, the sizes of semiconductor devices shall be larger in some degree than that of semiconductor chips.

Accordingly, it is necessary to achieve more fully downsized, thinned and lightweight semiconductor devices and to develop semiconductor devices in which the areal size is reduced to that of semiconductor chips.

In that situation, some proposals have been made for making chip-size semiconductor devices. One is a flip chip bonding method of directly bonding chips to a printed circuit board with an under filler injected therebetween. However, the flip chip bonding method requires high-level packaging techniques of package makers and, in addition, increases the packaging costs, since the step of under filler injection takes much time.

Another method proposed for chip-size semiconductor devices comprises sealing semiconductor chips all at one time in a wafer, followed by cutting the thus-sealed wafer into individual chip-size semiconductor devices.

Semiconductor-sealing resin compositions to be used for fabricating such multi-pinned, downsized and thinned semiconductor devices generally comprise an organic resin with an inorganic filler therein. For preparing the resin compositions of such composite materials, the two components are wetted with each other by shear stress to ensure the strength of the composite materials. Wetting them may be effected in Banbury mixers, kneaders, extruders, roll mills or the like, in which, however, the sealing resins are often contaminated with metal impurities derived from tool abrasion. If multi-pinned, downsized and thinned semiconductor devices are sealed with resin compositions contaminated with such metal impurities, they will be short-circuited in some extreme cases and their reliability will lower. Thus, high-tech semiconductor devices (packages) fabricated by the use of conventional sealing resins will often lose reliability.

Moreover, in downsized and thinned semiconductor devices, the resin composition flow space is reduced, and, in addition, the mold cavity inlet for the resin composition flow will be narrowed and thinned. If downsized and thinned semiconductor devices are fabricated by the use of a resin composition contaminated with metal impurities in a mode of transfer molding, the mold cavity inlet will be clogged with the impurities, often bringing about molding failure. If the mold cavity inlet is clogged with such impurities, the molding operation must be stopped every time and productivity is greatly lowered. Summarizing, downsizing semiconductor devices is confronted with many difficulties in point of productivity.

SUMMARY OF THE INVENTION

The present invention is directed to an improved, semiconductor device-sealing resin composition, with which stable and reliable semiconductor devices can be fabricated, and also to a semiconductor device fabricated by the use of the composition.

The semiconductor-sealing resin composition of the invention contains a filler (A) of spherical fused silica having a maximum particle size of 45 μm or less, and may contain metal impurities having a particle size of 53 μm or less.

The semiconductor device of the invention is sealed with a resin composition which contains a filler (A) consisting essentially of spherical fused silica having a maximum particle size of 45 μm or less and may contain metal impurities having a particle size of 53 μm or less.

DESCRIPTION OF THE PREFERRED EMBODIMENTS

Figure 1:
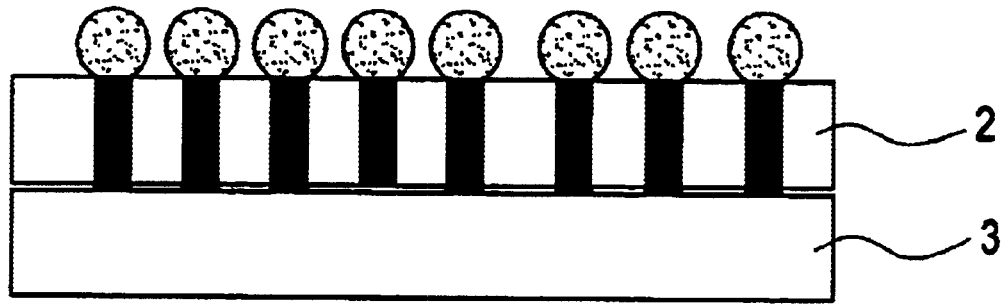
FIG. 1 is vertical cross-sectional view showing one embodiment of a semiconductor device sealed with the resin composition of the invention.

The invention is described in more detail hereinunder.

The filler (A) in the resin composition of the invention is (consists essentially of) spherical fused silica, and its maximum particle size must be at most 45 μm for moldability of the resin composition.

If the maximum particle size of the filler (A) therein is larger than 45 μm, it lowers the fluidity of the resin composition and wakes it difficult to seal downsized and thinned semiconductor devices with the composition. The maximum particle size of the filler (A) may be controlled by any method of sieving, centrifugal precipitation, cyclone separation, etc. For example, for sieving, the meshes of the sieve to be used are properly selected to thereby control the size of the filler (A) to be sieved therethrough. The maximum particle size of the filler (A) as referred to indicates the maximum value of the particle size thereof measured with a laser diffraction/scattering particle size distribution analyzer.

For reducing the percent defective product in semiconductor fabrication, the mean particle size of the filler (A) is preferably at most 30 μm, more preferably at most 20 μm, even more preferably at most 10 μm.

Preferably, the filler (A) content of the resin composition of the invention falls between 30 and 98% by weight. Having the filler (A) content within the defined range, the temperature cycle of the resin composition may be improved and the resin composition easy to mold.

Preferably, the filler (A) for use in the invention is pre-processed with a coupling agent, such as a silane coupling agent, a titanate coupling agent or the like, for surface treatment. With the surface-treated tiller (A), the reliability of the semiconductor devices sealed may be improved. For the coupling agent, preferred are silane coupling agents such as epoxysilanes, aminosilanes, mercaptosilanes, etc.

Metal impurities may be present in the resin composition of the invention. For example, they will be derived from the starting materials for the composition and from the apparatus and its atmosphere used for producing the composition. In the invention, the maximum particle size of the metal impurities that may be in the resin composition must be at most 53 μm, preferably at most 50 μm, more preferably at most 45 μm, even more preferably at most 38 μm. Metal impurities having a maximum particle size of larger than 53 μm must not be in the resin composition, as causing various difficulties. For example, when semiconductor devices are fabricated through transfer molding of the resin composition, such large metal impurities, if in the composition, will clog the mold cavity inlet, thereby ending in molding failure. In addition, the semiconductor devices fabricated will be often short-circuited, and lose reliability.

For controlling the maximum particle size of the metal impurities that may be in the resin composition of the invention, for example, the resin composition is willed in a ceramic roll mill, then cooled and ground, and the resulting powder is contacted with a magnet at 8,000 gausses or more to remove coarse metal impurities from it. The apparatus to be used for preparing the starting materials and the resin composition shall be made of magnetic metals.

The particle size of metal impurities that may be present in the semiconductor-sealing resin composition of the invention is determined as follows: A sample of the resin composition (this may be an unused one or may be one used for sealing semiconductors) is ashed at 500° C. for 12 hours. The resulting ash is a mixture of the filler (A) and metal impurities. This is sieved through a 282-mesh sieve (having an opening size of 53 μm). The residue having remained on the sieve is observed with a microscope, separating the metal impurities from the filler (A), and the maximum particle size of the metal impurities is microscopically determined.

The resin in the resin composition of the invention is preferably an epoxy resin (B), in view of its electric properties, adhesiveness and cost. The epoxy resin (B) is not specifically limited, provided that it has at least 2 epoxy groups in the molecule. The epoxy resin of that type includes, for example, bisphenol. F-type epoxy resins, bisphenol A-type epoxy resins, linear aliphatic epoxy resins, alicyclic epoxy resins, heterocyclic epoxy resins, halogenoepoxy resins, phenol-novolak-type epoxy resins, cresol-novolak-type epoxy resins, dicyclopentadiene skeleton-containing epoxy resins, biphenyl skeleton-containing epoxy resins, naphthalene skeleton-containing epoxy resins, etc. From their reliability, preferred are biphenyl skeleton-containing epoxy resins. One or more of these may be used either singly or as combined.

The amount of the epoxy resin (B) present in the resin composition of the invention is preferably at least 0.5% by weight in view of the moldability of the composition, but is preferably at most 50% by weight in view of the temperature cycle reliability thereof.

The resin composition may contain a curing agent (C). The curing agent (C) is not specifically limited, provided it can cure the epoxy resin (B). The curing agent of that type includes, for example, phenolic resin derivatives having at least 2 phenolic hydroxyl groups, polyamide derivatives, acid anhydrides, polymercaptans, etc. For moisture-resistant reliability, preferred are phenolic resin derivatives, especially a phenol-novolak resin or a cyclohexylic phenol resin.

The amount of the curing agent (C) present in the resin composition of the invention is preferably at least 0.5% by weight to provide moldability of the composition, but is preferably at most 50% by weight to provide temperature cycle reliability. Preferably, the chemical equivalent ratio of the epoxy resin to the curing agent falls between 0.8 and 1.2 for adhesiveness of the The resin composition of the invention may optionally contain a curing promoter capable of promoting the curing reaction of the epoxy resin (B) with the curing agent (C). The curing promoter is not specifically limited, provided that it promotes the curing reaction. For example, it includes imidazole compounds such as 2-methylimidazole, 2,4-dimethylimidazole, 2-ethyl-4-methylimidazole, 2-phenylimidazol, 2-phenyl-4-ethylimidazole, 2-heptadecylimidazole, etc.; tertiary amine compounds such as triethylamine, benzyldimethylamine, α-methylbenzyldimethylamine, 2-(dimethylaminomethyl) phenol, 2,4,6-tris(dimethylaminomethyl)phenol, 1,8-diazabicyclo(5,4,0)undecene-7, etc.; organometal compounds such as zirconium tetramethoxide, zirconium tetrapropoxide, tetrakis (acetylacetonato) zirconium, tri (acetylacetonato) aluminium, etc.; organophosphine compounds such as triphenylphosphine, trimethylphosphine, triethylphosphine, tributylphosphine, tri(p-methylphenyl) phosphine, tri(nonylphenyl)phosphine, etc. Of those, preferred are triphenylphosphine or 1,8-diazabicyclo (5,4,0) undecene-7 as having good moisture resistance. One or more of these curing promoters may be used either singly or as combined. Preferably, the amount of the curing promoter in the resin composition falls between 0.01 and 10 parts by weight relative to 100 parts by weight of the epoxy resin (B) therein.

The resin composition of the invention may optionally contain any of flame retardants such as antimony trioxide, etc.; colorants such as carbon black, iron oxide, etc.; ion scavengers such as hydrotalcite, etc.; elastomers such as silicone rubbers, olefinic copolymers, modified nitrile rubbers, modified polybutadiene rubbers, modified silicone oils, etc.; thermoplastic resins such as polyethylene, etc.; lubricants such as long-chain fatty acids, metal salts of long-chain fatty acids, esters of long-chain fatty acids, amides of long-chain fatty acids, paraffin waxes, etc.; crosslinking agents such as organic peroxides, etc.

Preferably, the resin composition of the invention is melt kneaded. It may be prepared by melt kneading the components in any known method using, for example, Banbury mixers, kneaders, roll mills, single-screw or twin-screw extruders, co-kneaders, etc. It is desirable that the essential parts of these machines are wade of magnetic metals or non-metallic substances.

The method of sealing semiconductor chips with the resin composition of the invention is not specifically limited, for which is employable any ordinary molding mode of, for example, transfer molding, injection molding, casting, potting, screen printing, etc. In the method, the molding temperature of the resin composition preferably falls between room temperature and 180° C., and the molded resin composition is preferably post-cured at 150 to 180° C. for 2 to 16 hours.

Figure 2:
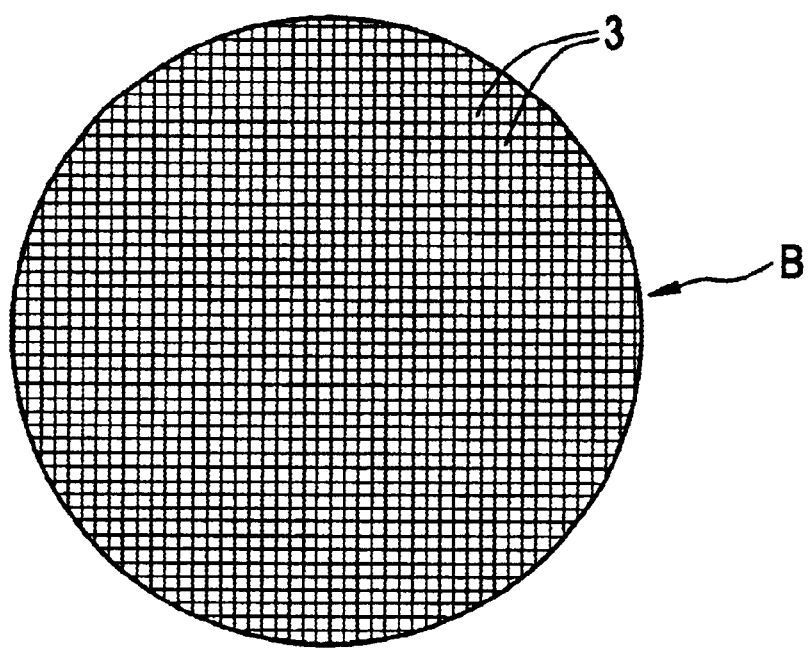
FIG. 2 is a plan view showing one embodiment of a wafer to be sealed with the resin composition of the invention.

The resin composition of the invention is especially useful in fabricating semiconductor devices with semiconductor chips sealed with the resin composition in a wafer, as in FIG. 1 and FIG. 2. The semiconductor wafer, thus fabricated, is cut into individual semiconductor devices, concretely, the production method is described, for example, in Nikkei Microdevice for August 1998, page 52.

In the method, the step of forming a protective film of the resin composition may be effected as follows: A circuit is printed on a board, and then coated with a passivation film. The resulting wafer is set on a lower mold, and a resin composition is put on it. This is sandwiched between the lower mold and an upper mold with a release film being inserted between the wafer and the upper mold, and molded under heat and pressure to ram a film of the resin composition having a predetermined thickness. The thickness of the resin composition film is not specifically limited. In general, the film may be from 30 to 2000 $\mu$m thick, but preferably from 30 to 300 $\mu$m thick, more preferably from 30 to 150 $\mu$m thick. Next, the molding is taken out, and the release film is peeled off. For post-curing the resin composition, the wafer is heated at about 180° C. for 5 hours or longer. The wafer thus having the protective film formed thereon is cut into individual semiconductor chips as semiconductor devices. These are chip-size packages (CSPs).

The method of fabricating semiconductor devices is very advantageous, since a large number of semiconductor devices can be fabricated in one molding operation and since a plurality of semiconductor devices can be inspected all at a time in a wafer. Having these advantages, the method is inexpensive and does not take much time, and it realizes mass production of semiconductor devices. In addition, the areal size of the chip-size packages to be fabricated therein may be reduced to be equal to that of the semiconductor chips mounted thereon, and the thickness thereof may be much reduced. The value added to the chip-size packages is high.

If desired, both surfaces of the wafer may be sealed with the resin composition. For thinned semiconductor devices, however, it is desirable that only one surface of the wafer is sealed with it.

EXAMPLES

Examples 1 to 8, Comparative Examples 1 to 3

Tables 1 and 2, below, are referred to. Table 1 shows materials for the components of resin compositions to be prepared herein; and Table 2 shows the constitution (compositional ratio) of the resin compositions prepared and the test data thereof. Precisely, these show the type, the maximum particle size, the mean particle size and the amount of the filler used herein, the type and the amount of the face-treating agent for the filler, the type and the amount of the epoxy resin used, the type and the amount of the curing agent used, the type and the amount of the curing promoter used, the type and the amount of the colorant used, the type and the amount of the lubricant used, the maximum particle size of metal impurities in the resin compositions prepared, and the type of the samples of semiconductor packages produced in Examples 1 to 8 and comparative Examples 1 to 3, and show the data of the samples tested for thermal cycle durability (T/C short), pressure cooker durability (PCT) and moldability (packing facility and packing time).

The resin compositions were prepared as follows: The materials shown in Table 1 were blended dry in a mixer, in different ratios as indicated in Table 2. The resulting mixture was kneaded in a roll mill at 90° C., then cooled, and powdered to make a resin composition.

Semiconductor packages were fabricated according to two methods mentioned below, in which the mold temperature was 175° C. The samples for the thermal cycle test and the pressure cooker test (PCT) were kept heated under pressure for 300 seconds in producing them.

Figure 3:
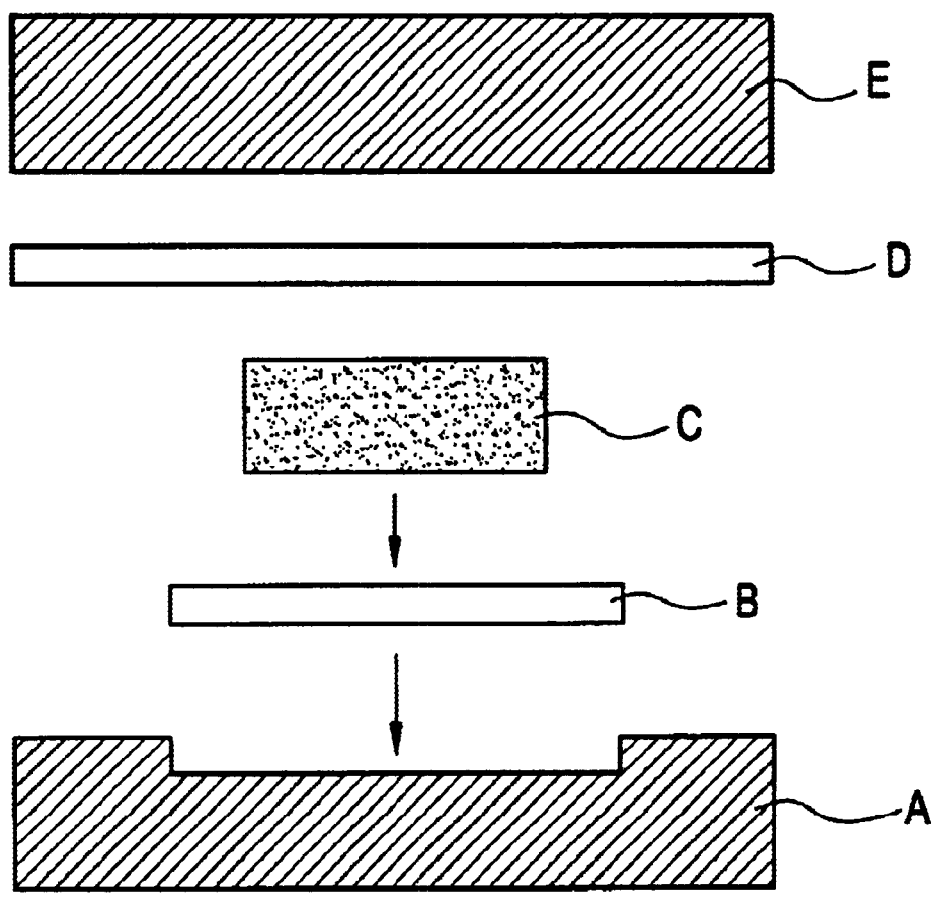
FIG. 3 is an explanatory view illustrating one embodiment of a process of sealing a semiconductor wafer with the resin composition of the invention.

Package Fabrication (for CSP):

FIG. 3 shows the process employed herein for fabricating the samples of chip-size packages (CSPs). As illustrated, an 8-inch silicon wafer (B) with 500 semiconductor chips (7×7 mm, 48 pins) printed thereon is set on a lower mold (A). A tablet (C) of the resin composition of each Example or Comparative Example as above is put on the center of the silicon wafer (B). An upper mold (E) is put over it with a release film (D) being inserted therebetween, and the mold is closed. In that condition, the resin composition is pressed against the wafer under heat to form a resin layer having a thickness of 100 $\mu$m.

The molding is taken out, and the release film (D) is peeled off. This is as in FIG. 2 showing its plan view. As illustrated, the wafer is an aggregate of semiconductor chips 3 before being cut into individual chips. Next, a solder ball is mounted on the area for the outer electrode, and the wafer is cut into individual semiconductor chips to give the chip-size packages as in FIG. 1. In FIG. 1, 1 is an outer electrode, 2 is a resin composition, and 3 is a semiconductor chip.

Package Fabrication (for BGA):

A semiconductor chip (5×5 mm) is mounted on a polyimide interposer (outer size, 6×8 mm, 48 pins), and its contact point is sealed with a resin composition. Three semiconductor packages are sealed in one molding operation.

The samples produced herein were tested and evaluated according to the methods mentioned below.

Maximum Particle Size of Metal Impurities:

A sample of a semiconductor-sealing resin composition to be tested is ashed at 500° C. for 12 hours. The resulting ash is sieved through a 282-mesh sieve (having an opening size of 53 $\mu$m) and a 391-mesh sieve (having an opening size of 32 $\mu$m). The residue having remained on each sieve is observed with a microscope with separating the metal impurities from the filler (A), and the maximum particle size of the metal impurities is microscopically determined.

Thermal Cycle Test (T/C Short):

100 semiconductor packages are subjected to a 500-cycle stress test in which the temperature difference is between −55° C. and 125° C. After tested, these are subjected to an electric test in which the number of the samples with pin-to-pin short-circuit and those with pins broken is counted.

Pressure Cooker Test (PCT):

Semiconductor packages are left at 143° C. and 100% RH, and the time taken before the semiconductor chip begins to peel from the resin composition at their interfacial boundary is measured. The interfacial peeling is detected with an ultrasonic flaw detector.

Moldability (Packing Facility and Packing Time):

In molding semiconductor packages, the shortest packing time within which the appearances of the packages molded are the test is measured. The packing time indicates the time of one cycle that covers the process of setting the semiconductor parts with a sealant on a mold, then heating them under pressure, and taking the sealed package out of the mold. 500 CSPs are fabricated in one molding process, while three BGA packages are in one molding process. The packing time is represented in terms of the time for finishing one package (seconds/one package).

For their appearances, the packages fabricated were macroscopically checked for resin flows or spots on their surfaces. Those with resin flows and/or spots are not good (NG). In CPS fabrication, the packages for which the wafers are scratched or broken are not good (NG).

Regarding the packing facility, the packages molded within the shortest packing time are checked for voids of 0.5 mm or larger, and those having such voids are not good (NG). The number of NG samples is counted.

Gelling Time (Curability):

Resin composition are left on a hot plate at 175° C., and the time before they lose their fluidity is measured. All samples of Comparative Examples and Examples took 100 seconds to gel.

TABLE 1

| Components | Details | |
|---|---|---|
| Filler | I | Spherical fused silica having a mean particle size of 25 μm (maximum particle size: 74 μm) |
| | II | Spherical fused silica having a mean particle size of 25 μm (maximum particle size: 45 μm) |
| | III | Spherical fused silica having a mean particle size of 14 μm (maximum particle size: 45 μm) |
| | IV | Spherical fused silica having a mean particle size of 8 μm (maximum particle size: 45 μm) |
| | V | Spherical fused silica having a mean particle size of 3 μm (maximum particle size: 30 μm) |
| | VI | Spherical fused silica having a mean particle size of 3 μm (maximum particle size: 10 μm) |
| Surface-treating Agent | | γ-glycidoxypropyltrimethoxysilane |
| Epoxy Resin | I | Bisphenol A-type epoxy resin (having an epoxy equivalent of 195) |
| | II | 4,4'-Bis(2,6-epoxypropoxy)-3,3',5,5'-tetramethylbiphenyl (having an equivalent of 195) |
| Curing Agent | I | Methylhexahydrophthalic anhydride (having a neutralization equivalent of 168) |
| | II | Phenol-novolak (having a hydroxyl equivalent of 105) |
| Curing Promoter | I | 1,8-Diazabicyclo(5,4,0)undecene-7 |
| | II | Triphenylphosphine |
| Colorant | | Carbon black |
| Lubricant | | Carnauba wax |

TABLE 2

| | | Co.Ex. 1 | Co.Ex. 2 | Co.Ex. 3 | Ex 1 | Ex 2 | Ex 3 | Ex 4 | Ex 5 | Ex 6 | Ex 7 | Ex 8 |
|---|---|---|---|---|---|---|---|---|---|---|---|---|
| Filler | type | I | I | I | II | III | IV | V | VI | III | VI | VI |
| maximum particle size | [μm] | 74 | 74 | 74 | 45 | 45 | 45 | 30 | 10 | 45 | 10 | 10 |
| mean particle size | [μm] | 25 | 25 | 25 | 25 | 14 | 8 | 3 | 3 | 14 | 3 | 3 |
| amount added | [wt %] | 49.5 | 49.5 | 49.5 | 49.5 | 49.5 | 49.5 | 49.5 | 49.5 | 49.5 | 49.5 | 49.5 |
| Surface-treating Agent | [wt %] | 0.5 | 0.5 | 0.5 | 0.5 | 0.5 | 0.5 | 0.5 | 0.5 | 0.5 | 0.5 | 0.5 |
| Epoxy Resin | type | I | II | I | I | I | I | I | I | II | I | II |
| | [wt %] | 27.4 | 32.8 | 27.4 | 27.4 | 27.4 | 27.4 | 27.4 | 27.4 | 32.8 | 27.4 | 32.8 |
| Curing Agent | type | I | II | I | I | I | I | I | I | II | I | II |
| | [wt %] | 21.3 | 15.9 | 21.3 | 21.3 | 21.3 | 21.3 | 21.3 | 21.4 | 15.9 | 21.3 | 15.9 |
| Curing Promoter | type | I | II | I | I | I | I | I | I | II | I | II |
| | [wt %] | 0.3 | 0.3 | 0.3 | 0.3 | 0.3 | 0.3 | 0.3 | 0.3 | 0.3 | 0.3 | 0.3 |
| Colorant | [wt %] | 0.5 | 0.5 | 0.5 | 0.5 | 0.5 | 0.5 | 0.5 | 0.5 | 0.5 | 0.5 | 0.5 |
| Lubricant | [wt %] | 0.5 | 0.5 | 0.5 | 0.5 | 0.5 | 0.5 | 0.5 | 0.5 | 0.5 | 0.5 | 0.5 |
| Metal Impurities (maximum particle size) | [μm] | 160 | 110 | 80 | 50 | 50 | 50 | 50 | 50 | 50 | 50 | 50 |
| Type of Packages | | BGA | BGA | CSP | BGA | CSP | CSP | CSP | CSP | BGA | CSP | CSP |
| T/C Short Test | [number of failed packages] | 28 | 20 | 49 | 0 | 0 | 0 | 0 | 0 | 0 | 0 | 0 |
| PCT | [hrs] | 25 | 150 | 25 | 50 | 50 | 50 | 50 | 50 | 300 | 50 | 300 |
| Moldability (packing facility) | [number of failed packages/-all packages tested] | 30/500 | 36/500 | NG | 0/500 | 7/500 | 6/500 | 3/500 | 0/500 | 4/500 | 0/500 | 0/500 |

TABLE 2-continued

|  | | Co.Ex. 1 | Co.Ex. 2 | Co.Ex. 3 | Ex 1 | Ex 2 | Ex 3 | Ex 4 | Ex 5 | Ex 6 | Ex 7 | Ex 8 |
|---|---|---|---|---|---|---|---|---|---|---|---|---|
| Moldability (packing time) | [second per one package] | 70.0 | 70.0 | — | 70.0 | 0.6 | 0.5 | 0.4 | 0.4 | 70.0 | 0.4 | 0.4 |

Semiconductor packages, if short-circuited in the thermal cycle test (T/C short test), are not reliable and must not be in practical use. The samples of Comparative Examples 1 to 3, as having large metal impurities of above 53 μm in size, are not reliable.

The samples of Examples 1 to 8 in which the metal impurities have a maximum particle size of smaller than 53 μm and the filler has a maximum particle size of not larger than 45 μm all passed the T/C short test and had good moldability (packing facility). These Examples gave stable and highly reliable products.

The samples of Examples 6 and 8 in which the resin composition used contained a phenolic derivative had better adhesiveness (as proven in PCT testing) even under high-temperature and high-humidity conditions. PCT testing demonstrated herein is an accelerated life test, and its data correspond to the life of the packages in an ordinary atmosphere. The samples that are stable in the PCT condition employed herein have no problem in practical use. It is understood that the resin composition containing a phenolic derivative much prolongs the life of the packages.

More downsized and thinned semiconductor packages are desired, but their production is difficult.

However, according to the technique of the invention, chip-size packages (CSPs) that are more downsized and thinned than ball grid array (BGA) packages and therefore far more downsized than conventional packages can be efficiently fabricated within a reduced packing time, as in Examples 2 to 5, 7 and 8.

The semiconductor devices according to the invention are especially useful in downsized lightweight portable appliances.

While the invention has been described in detail and with reference to specific embodiments thereof, it will be apparent to one skilled in the art that various changes and modifications can be made therein without departing from the spirit and scope thereof.

What is claimed is:

1. A resin composition for sealing semiconductor devices, which comprises metal particle impurities having a particle size of 53 μm or less obtained by subjecting the impurities to a magnet of 8,000 gausses or more and a filler (A) consisting essentially of spherical fused silica having a maximum particle size of 45 μm or less.

2. The semiconductor-sealing resin composition as claimed in claim 1, which further comprises an epoxy resin (B) and 5–50% by weight of a curing agent (C), wherein said curing agent (C) comprises phenolic resin having at least two phenolic hydroxy groups.

3. The semiconductor-sealing resin composition as claimed in claim 2, wherein said epoxy resin (B) is a biphenyl skeleton-containing epoxy resin.

4. The semiconductor-sealing resin composition as claimed in claim 2, wherein said curing agent (C) is selected from the group consisting of a phenol-novolak resin and a cyclohexylic phenol resin.

5. The semiconductor-sealing resin composition as claimed in claim 2, which further comprises a curing promoter.

6. The semiconductor-sealing resin composition as claimed in claim 5, wherein said curing promoter is 1,8-diazabicyclo(5,4,0)undecene-7 or triphenylphosphine.

7. The semiconductor-sealing resin composition as claimed in claim 1, which is applied to sealing semiconductor devices to be fabricated by sealing semiconductor chips in the form of wafers, followed by cutting said wafers into individual chips.

8. A semiconductor sealed with a resin composition as claimed in any of claims 2 to 7.

9. A semiconductor device sealed with a resin composition that comprises metal particle impurities having a particle size of 53 μm or less obtained by subjecting the impurities to a magnet of 8,000 gausses or more and a filler (A) consisting essentially of spherical fused silica having a maximum particle size of 45 μm or less.

10. A silicon wafer having a surface having a multiplicity of semiconductor chip portions provided with circuitry printed on said wafer surface, a multiplicity of electrodes extending outwardly from said surface of said circuitry, and a sealing resin sealed to said wafer surface and to said electrodes, said sealing resin consisting essentially of a mixture of:
    an epoxy resin having at least 2 epoxy groups in the molecule, and
    a filler (A) 30–98% by weight consisting essentially of spherical fused silica particles having a maximum particle size of 45 μm or less; and
    metal particle impurities having a particle size of 53 μm or less obtained by subjecting the impurities to a magnet of 8,000 gausses or more.

11. The wafer defined in claim 10, wherein said spherical fused filler (A) is surface treated with a coupling agent selected from the group consisting of silanes and titanates.

12. The wafer defined in claim 11, wherein said coupling agent is a silane selected from the group consisting of epoxysilanes, aminosilanes and mercaptosilanes.

* * * * *